United States Patent
Schmidt

(10) Patent No.: US 8,125,036 B2
(45) Date of Patent: Feb. 28, 2012

(54) INTEGRATED CIRCUIT HAVING AN EDGE PASSIVATION AND OXIDATION RESISTANT LAYER AND METHOD

(75) Inventor: Gerhard Schmidt, Wernberg-Wudmath (AT)

(73) Assignee: Infineon Technologies Austria AG, Villach (AT)

(*) Notice: Subject to any disclaimer, the term of this patent is extended or adjusted under 35 U.S.C. 154(b) by 262 days.

(21) Appl. No.: 11/686,154

(22) Filed: Mar. 14, 2007

(65) Prior Publication Data

US 2007/0222023 A1   Sep. 27, 2007

(30) Foreign Application Priority Data

Mar. 14, 2006  (DE) .......................... 10 2006 011 697

(51) Int. Cl.
- H01L 23/58 (2006.01)
- H01L 27/088 (2006.01)
- H01L 21/70 (2006.01)
- H01L 21/332 (2006.01)
- H01L 21/336 (2006.01)

(52) U.S. Cl. ........ 257/398; 438/140; 438/298; 438/970; 257/400; 257/519; 257/648; 257/E21.545; 257/E21.557; 257/E29.016

(58) Field of Classification Search .................. 257/499, 257/398, 400, 519, 648, E29.016, E21.545, 257/E51.557; 438/298, 140, 970

See application file for complete search history.

(56) References Cited

U.S. PATENT DOCUMENTS

| | | | |
|---|---|---|---|
| 5,086,332 A | | 2/1992 | Nakagawa et al. |
| 6,445,054 B1* | | 9/2002 | Traijkovic et al. ............ 257/487 |
| 6,455,911 B1* | | 9/2002 | Stephani et al. ............. 257/493 |
| 6,637,866 B1* | | 10/2003 | Cornell et al. .................. 347/64 |
| 2003/0034495 A1* | | 2/2003 | Casady et al. .................. 257/77 |
| 2004/0056269 A1 | | 3/2004 | Chen |
| 2004/0119087 A1* | | 6/2004 | Bose Jayappa Veeramma et al. ............................ 257/100 |
| 2005/0194662 A1* | | 9/2005 | Schmidt et al. ............... 257/646 |
| 2006/0051933 A1* | | 3/2006 | Pendharkar .................... 438/451 |
| 2006/0057768 A1* | | 3/2006 | Nakanishi et al. ............ 438/106 |

OTHER PUBLICATIONS

"The Effects of Si Incorporation on the Electrochemical and Nanomechanical properties of DLC Thin Films", P. Papakonstantinou, et al., Elsevier Science B.V. 2002 (7 pgs.).

* cited by examiner

Primary Examiner — Kevin Parendo
(74) Attorney, Agent, or Firm — Dicke, Billig & Czaja, PLLC

(57) ABSTRACT

The Examiner objected to the abstract of the disclosure because it contains the phrase "comprising."
The Abstract does not include the phrase "comprising," however, please amend the abstract as follows:
An integrated circuit having a semiconductor component arrangement and production method is disclosed. The integrated circuit as described includes an oxide layer region is provided as a protection against oxidation in the edge region on the surface region of an underlying semiconductor material region.

39 Claims, 9 Drawing Sheets

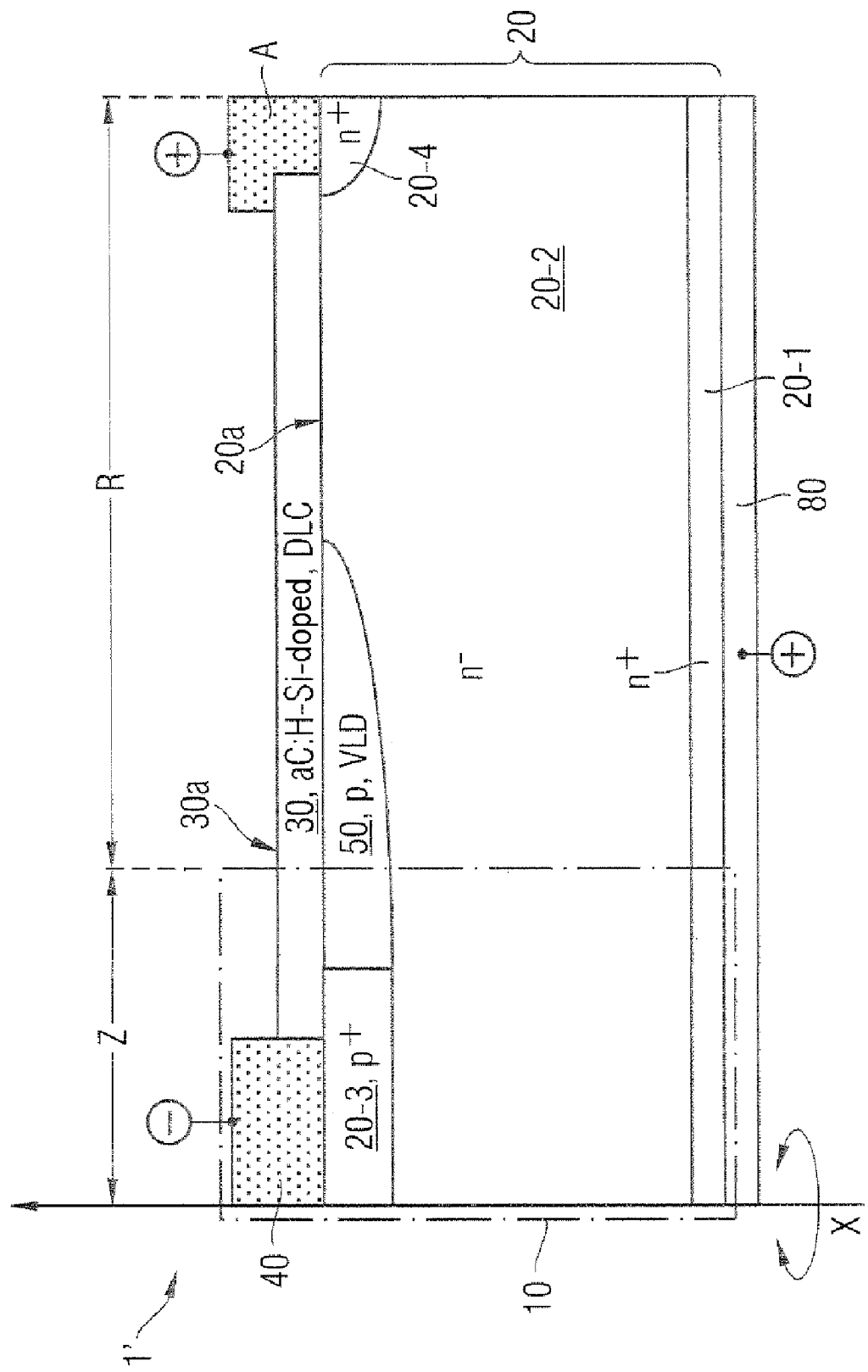

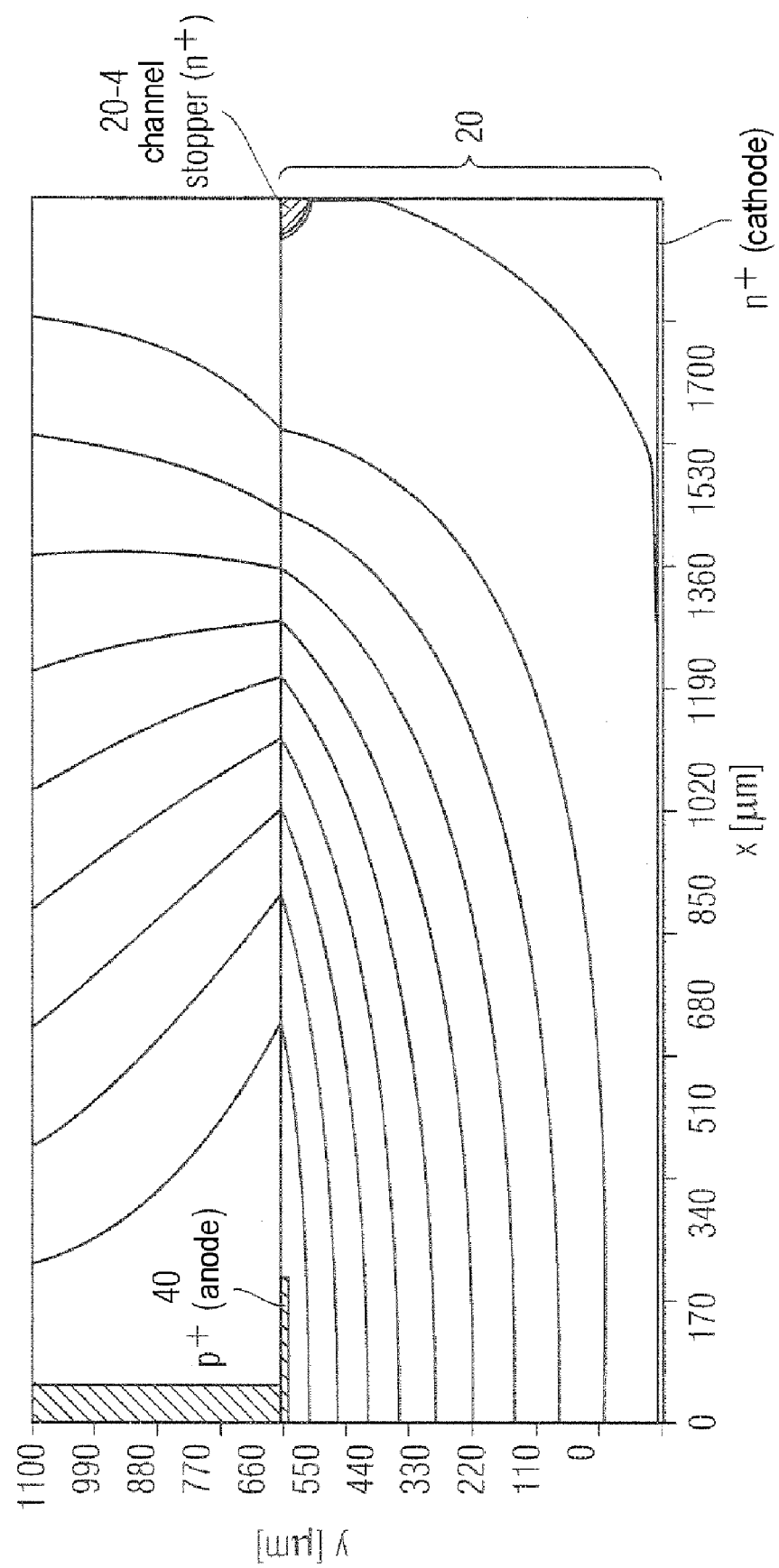

INTEGRATED CIRCUIT HAVING AN EDGE PASSIVATION AND OXIDATION RESISTANT LAYER AND METHOD

BACKGROUND

The present invention relates to an integrated circuit having a semiconductor arrangement and to a method for producing an integrated circuit.

The aspects of functional and structural long-term stability are of considerable importance in the conception of modern semiconductor components and modern semiconductor component arrangements. In order to establish potential conditions exhibiting long-term stability in semiconductor components or semiconductor component arrangements formed in a semiconductor material region, therefore, a passivation is formed in an edge region of the arrangement and consequently in an edge region of the underlying semiconductor material region, the passivation also being referred to as a passivation layer region. The passivation layer region in the edge region of the underlying semiconductor material region serves for realizing a desired field distribution at the edge of the semiconductor component arrangement, in order e.g., to prevent premature electrical breakdowns in the underlying semiconductor material region, e.g., on account of an avalanche multiplication or on account of dielectric breakdowns.

In this case, particular attention is paid to the respective passivation layer region both in the conception and in the actual production and use of semiconductor component arrangements. Particularly in the case of robust operating or else production conditions, however, the necessarily required passivation layer region may be subjected to disadvantageous changes with regard to its passivation properties for operation and for the structure as a result of material ambient influences, e.g., as a result of a provided atmosphere or the like, on account of accompanying chemical and/or physical conversions.

For these and other reasons, there is a need for the present invention.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

These and further embodiments of the present invention are explained below with reference to the accompanying figures illustrate in the exemplary embodiments of the invention:

FIG. 8 illustrates a schematic and sectional side view of a semiconductor component arrangement formed in a conventional manner.

FIG. 9 illustrates, in the form of a graph, the potential distribution such as may be present in a known semiconductor component arrangement.

DETAILED DESCRIPTION

Figure 1:
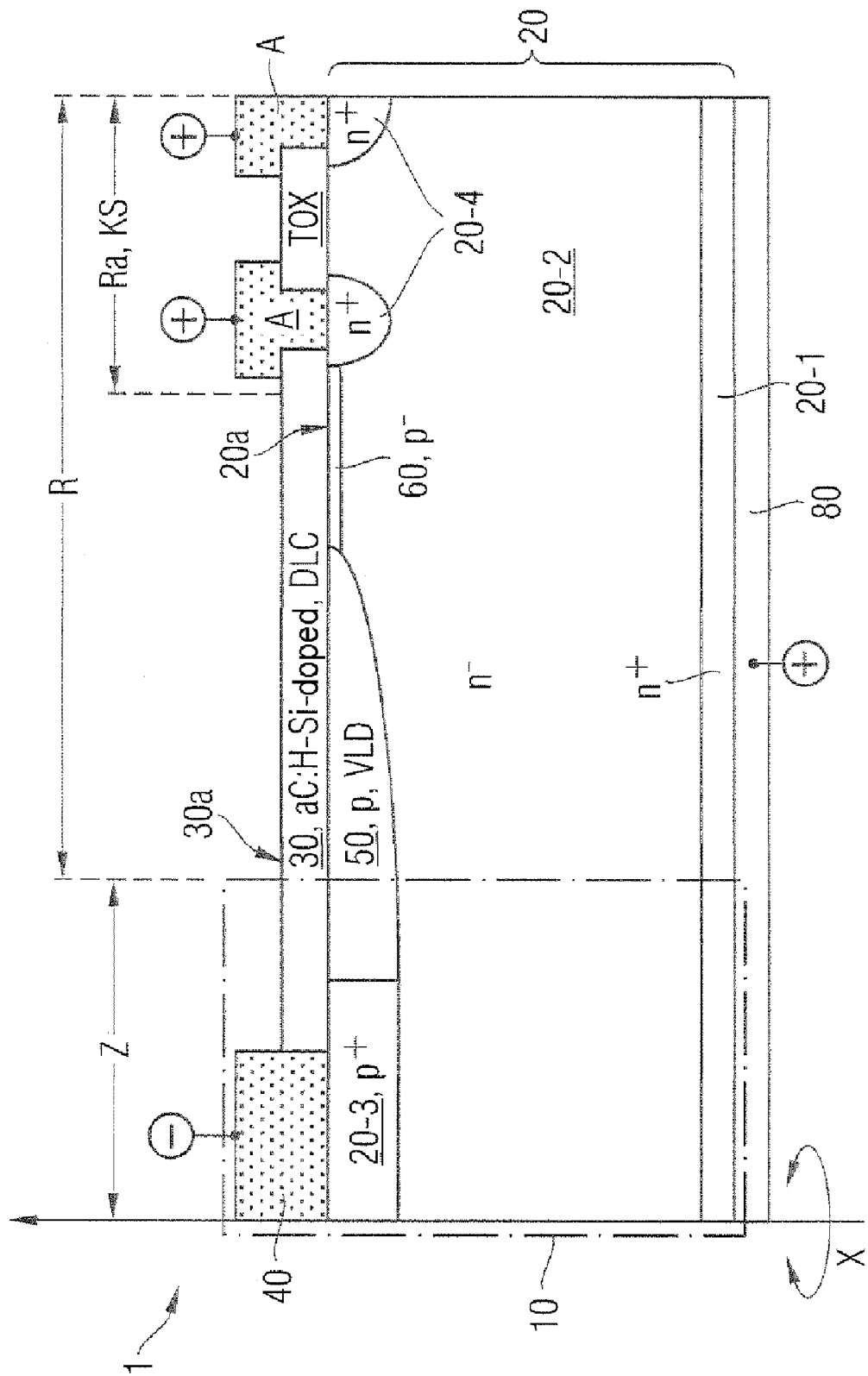
FIG. 1 illustrates a schematic and sectional side view of a first embodiment of a semiconductor component arrangement.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One or more embodiments provide an integrated having a semiconductor component arrangement and also a corresponding production method by an integrated circuit semiconductor component arrangement in which a passivation layer region provided is formed in a particularly reliable and long-term-stable manner with regard to its passivation properties.

One embodiment provides an integrated semiconductor component arrangement, in which a semiconductor material region having a surface region is formed, in which an arrangement of one or more semiconductor components is formed in a central region of the semiconductor material region, and in which a passivation layer region is formed on the surface region of the semiconductor material region in an edge region thereof, wherein the passivation layer region is formed by a or at the top and removed from the surface region of the semiconductor material region with a covering layer that is resistant to etching and chemically inert—in particular with respect to oxygen free radicals—and wherein an oxide layer region is provided as a protection against oxidation on the surface region of the semiconductor material region in the edge region.

One embodiment of the present invention involves forming an oxide region or oxide layer region on the surface region of the semiconductor material region at one or at specific locations. The oxide explicitly provided on the surface of the semiconductor material region, in particular in the edge region thereof, gives rise to a protection against oxidation processes that may arise in particular at or in spatial proximity to specific defects of the underlying material. In other words, a protection arises against oxidation processes that can form in particular in the zones of the underlying semiconductor material and bear a positive polarity in the reverse-biased state, such as e.g., an n-doped channel stopping zone or an n-doped base zone passing to the surface, which zone adjoins a p-doped zone toward the chip edge. The opposite situation holds true given inverted doping conditions in which the base zone (drift zone) would be p-doped. Those regions which bear the positive polarity are jeopardized potentially with respect with anodic oxidation processes.

The oxide layer region or a part of the oxide layer region may be formed in an outer edge region of the edge region of the semiconductor material region, the outer edge region being spaced apart and remote from the central region.

The oxide material region or a part of the oxide material region may be formed in a multilayer fashion.

The oxide material region or a part of the oxide material region may be covered with a covering layer.

The covering layer or a part of the covering layer may be formed by the passivation layer region or by a part of the passivation layer region.

The oxide layer region or a part of the oxide layer region may be formed as a physicochemical conversion region of the surface region of the semiconductor material region.

The oxide layer region or a part of the oxide layer region may be formed as a material region deposited on the surface region of the semiconductor material region.

The oxide material region or a part of the oxide material region may be formed above and/or in the region of one or more channel stopper regions or a part of one or more channel stopper regions, in particular directly above and in direct contact with one or more channel stopper regions.

A channel stopper region may be formed as one or with a plurality of doping zones of a first conductivity type n in the surface region of the semiconductor material region.

A doping zone or VLD zone having a varying doping, namely one that decreases toward the edge of the semiconductor material region, of a second conductivity type p may be formed in the surface region of the semiconductor material region in the transition between the central region and the edge region of the semiconductor material region.

The VLD zone may be formed such that it reaches as far as the outer edge region of the semiconductor material region.

The VLD zone may be formed such that it reaches as far as the channel stopper region of the semiconductor material region.

In another embodiment of the semiconductor component arrangement according to the invention, a hydrogen-containing and silicon-doped amorphous carbon layer or an aC:H layer is additionally or alternatively formed as the covering layer.

In another embodiment of the semiconductor component arrangement according to the invention, the covering layer is formed as a DLC layer.

Above and hereinafter the terms aC:H layer and DLC layer are often used synonymously in the broader sense. In the narrower sense, the more general term is given by the aC:H layer. The term DLC is understood in the narrower sense if the aC:H layers are deposited such that—given a correspondingly high DC bias—a high density and hardness result in such a way that the properties also become diamondlike (DLC=diamondlike carbon). Polymerlike layers having a low density and hardness result otherwise—given a low bias.

In accordance with a further embodiment of the semiconductor component arrangement according to the invention, the covering layer is additionally or alternatively formed with a dopant concentration of silicon of at least one atom %.

In accordance with a further embodiment of the semiconductor component arrangement according to the invention, the covering layer is additionally or alternatively formed with a dopant concentration of silicon with less than 50 atom %.

In one embodiment of a configuration of the semiconductor component arrangement according to the invention, the covering layer is additionally or alternatively formed with a dopant concentration of silicon below a stoichiometric ratio of silicon to carbon of 1:1.

In one embodiment of another configuration of the semiconductor component arrangement, according to the invention, the covering layer is alternatively formed as a silicon nitride layer.

A further embodiment of the semiconductor component arrangement according to the invention, the passivation layer region is formed at the bottom and facing the surface regions of the semiconductor material region or directly adjoining the latter with a base layer as a basic layer lying at the bottom.

In another embodiment of the semiconductor component arrangement according to the invention, the base layer is formed as a basic layer lying at the bottom with a layer thickness which corresponds in terms of its order of magnitude approximately to the order of magnitude of the shielding length of the material of the base layer.

In accordance with a further embodiment of the semiconductor component arrangement according to the invention, the base layer may be formed with or from a material or any desired combination of materials from the group consisting of a dielectric, an insulator, a silicon oxide, a silicon nitride, a polyimide, a silicone encapsulant, a semi-insulating material, an amorphous silicon, a carbon material, a silicon carbide, an amorphous carbon and a hydrogen-doped amorphous carbon.

It is conceivable in one manner and in accordance with a further embodiment of the semiconductor component arrangement according to the invention that the arrangement of one or more semiconductor components is formed with or from a semiconductor component or any desired combination of semiconductor components from the group consisting of a power transistor, a thyristor, a JFET, an IGBT, a high-voltage Pin diode and a Schottky diode.

Furthermore, in a further embodiment of the semiconductor component arrangement according to the invention, it may additionally or alternatively be provided that the edge region is formed with a planar edge termination or with a mesa-type edge termination.

A further embodiment of the present invention provides a method for producing an integrated semiconductor component arrangement, in which a semiconductor material region having a surface region is formed, in which an arrangement of one or more semiconductor components is formed in a central region of the semiconductor material region, and in which a passivation layer region is formed on the surface region of the semiconductor material region in an edge region thereof, wherein the passivation layer region is formed by a or at the top and removed from the surface region of the semiconductor material region with a covering layer that is resistant to etching and chemically inert—in particular with respect to oxygen free radicals—and wherein an oxide layer region is provided as a protection against oxidation on the surface region of the semiconductor material region in the edge region.

The oxide layer region or a part of the oxide layer region may be formed in an outer edge region of the edge region of the semiconductor material region, the outer edge region being spaced apart and remote from the central region.

The oxide material region or a part of the oxide material region may be formed in multilayer fashion.

The oxide material region or a part of the oxide material region may be covered with a covering layer.

The covering layer or a part of the covering layer may be formed by the passivation layer region or by a part of the passivation layer region.

The oxide layer region or a part of the oxide layer region may be formed as a physicochemical conversion region of the surface region of the semiconductor material region.

The oxide layer region or a part of the oxide layer region may be formed as a material region deposited on the surface region of the semiconductor material region.

The oxide material region or a part of the oxide material region may be formed above and/or in the region of one or more channel stopper regions or a part of one or more channel stopper regions, in particular directly above and in direct contact with one or more channel stopper regions.

A channel stopper region may be formed as one or with a plurality of doping zones of a first conductivity type n in the surface region of the semiconductor material region.

A doping zone or VLD zone having a varying doping, namely one that decreases toward the edge of the semiconductor material region, of a second conductivity type p may be formed in the surface region of the semiconductor material region in the transition between the central region and the edge region of the semiconductor material region.

The VLD zone may be formed such that it reaches as far as the outer edge region of the semiconductor material region.

The VLD zone may be formed such that it reaches as far as the channel stopper region of the semiconductor material region.

In a further embodiment of the method according to the invention for producing a semiconductor component arrangement, a hydrogen-containing and silicon-doped amorphous carbon layer or an aC:H layer is additionally or alternatively formed as the covering layer.

In another embodiment of the method according to the invention for producing a semiconductor component arrangement, the covering layer is formed as a DLC layer.

In accordance with a further embodiment of the method according to the invention for producing a semiconductor component arrangement, the covering layer is additionally or alternatively formed with a dopant concentration of silicon with at least one atom %.

In a further embodiment of the method according to the invention for producing a semiconductor component arrangement, the covering layer is additionally or alternatively formed with a dopant concentration of silicon with less than 50 atom %.

In one embodiment of the method according to the invention for producing a semiconductor component arrangement, the covering layer is additionally or alternatively formed with a dopant concentration of silicon below a stoichiometric ratio of silicon to carbon of 1:1.

In another embodiment of the method according to the invention for producing a semiconductor component arrangement, the covering layer is alternatively formed as a silicon nitride layer.

In accordance with a further embodiment of the method according to the invention for producing a semiconductor component arrangement, the passivation layer region is formed at the bottom and facing the surface regions of the semiconductor material region or directly adjoining the latter with a base layer.

In accordance with another embodiment of the method according to the invention for producing a semiconductor component arrangement, the base layer is formed with a layer thickness which corresponds in terms of its order of magnitude approximately to the order of magnitude of the shielding length of the material of the base layer.

In accordance with a further embodiment of the method according to the invention for producing a semiconductor component arrangement, the base layer may be formed with or from a material or any desired combination of materials from the group consisting of a dielectric, an insulator, a silicon oxide, a silicon nitride, a polyimide, a silicone encapsulant, a semi-insulating material, an amorphous silicon, a carbon material, a silicon carbide, an amorphous carbon and a hydrogen-doped amorphous carbon.

In accordance with a further embodiment of the method according to the invention for producing a semiconductor component arrangement that the arrangement of one or more semiconductor components is formed with or from a semiconductor component or any desired combination of semiconductor components from the group consisting of a power transistor, a thyristor, a JFET, an IGBT, a high-voltage Pin diode and a Schottky diode.

Furthermore, in a further embodiment of the method according to the invention for producing a semiconductor component arrangement, it may be provided that the edge region is formed with a planar edge termination or with a mesa-type edge termination.

In this case, planar may mean that the applied reverse voltage, at the chip top side, is reduced in a lateral direction as far as the sawing edge. For this purpose, the pn junction must pass to the surface, and at the chip edge there quite generally exists a channel stopper, which is at drain potential. Additional measures for controlling the electric field strength are, by way of example, field limiting rings, field plates or a weak p-type implantation adjoining the $p^+$-type well.

In the case of a mesa-type edge termination, the $p^+n$ junction runs horizontally as far as the surface and the field strength is set by oblique grindings or trenches through the blocking $p^+n$ junction.

These and further embodiments of the present invention are explained in more detail below:

The invention also relates to electrochemically resistant and robust surface passivations for semiconductor components.

In order to obtain potential conditions exhibiting long-term stability at the surface of a semiconductor component, it is necessary to apply a suitable passivation layer in the edge region. A distinction is made between edge terminations embodied in mesa-type fashion or in planar fashion, depending on the technology. The edge terminations primarily have the task of reducing the electric field strength in the edge region of the component, where the pn junction passes to the surface, such that a moderate field distribution occurs under blocking loading. As early as during the conception of the edge termination in the simulator, particular attention is paid to optimizing the field distribution such that the latter does not lead to a premature breakdown in the semiconductor body as a result of avalanche multiplication or to dielectric breakdown in the passivation layer. However, extraneous charges in the constructed chip can appreciably disturb the blocking behavior of the component.

The task of the passivation layer is to protect the semiconductor surface as well as possible with respect to such disturbing charges.

Layers composed of dielectric material (insulators) such as, for example, silicon oxide and silicon nitride or in combination with polyimide or silicone encapsulants are often used for the passivation. Insulating layers have the disadvantage, however, that, without complicated additional measures such as, for instance, field plates in the edge construction, they can protect the potential distribution only to a limited extent on account of the electrical pinchthrough as a result of the electrostatic induction effect of the surface charge.

Semi-insulating layers are also used as primary layer on the semiconductor surface. They include for example amorphous silicon or amorphous carbon /1/.

The semi-insulating layers have the advantage over the insulating layers that, on account of their morphology, they have a high density of charge-reversible states which can be utilized for shielding extraneous charges. The latter are generally always present in the mounted chip, either ion charges present as a result of the production process, or as a result of penetrating moisture or alkaline contamination in the encapsulant.

A semi-insulating passivation composed of an amorphous, hydrogen-containing carbon layer aC:H, such as results for example from a radiofrequency plasma deposition (PECVD) of a precursor composed of gaseous hydrocarbon, is advantageous here since this layer has a very high density of charge-reversible states. This can be determined for example in electron spin resonance measurements or ESR measurements /2/. However, high state density in the passivation layer can actively shield disturbing charges and hence guarantee an excellent blocking stability.

Furthermore, such aC:H layers are distinguished by a high durability, which is manifested in a high mechanical hardness and resistance to abrasion, and also a chemical resistance even to concentrated acids and alkaline solutions and an excellent blocking effect with respect to moisture. For this reason, they can also in turn be patterned only by using a plasma process.

On account of their diamondlike properties, aC:H layers are also referred to synonymously as DLC layers (DLC=diamondlike carbon). The layers are etched generally by using an oxygen plasma in which the ions—as during the deposition—also experience an additional acceleration on account of a DC bias that is established. It is only in this way that etching rates which are of the order of magnitude of the deposition rate can be obtained. In this case, the DC bias supports and accelerates the etching process on account of the additional kinetic energy of the oxygen free radicals, but is not absolutely necessary for the reaction as such /3/. The existence of oxygen free radicals may already lead to corrosion. In the case of hard DLC films for this purpose, molecular oxygen does not suffice for oxidation, however, according to B. Landkammer et al.

In order to safeguard the long-term reliability of the semiconductor components under operating conditions, extreme loadings are reproduced in a time acceleration experiment. This includes e.g., a test in which the component is stored under high air humidity and at high temperature with a reverse voltage present (H3TRB test=High Humidity, Temperature and Reverse Bias).

In corresponding reliability tests, a loading situation similar to the above-mentioned corrosion phenomenon in the presence of oxygen free radicals surprisingly results under the action of moisture in conjunction with a reverse voltage present at the same time.

The effect can be attributed to the fact that under the action of moisture with a reverse voltage present, an electrochemical reaction proceeds in which oxygen free radicals are liberated as a result of the electrolysis of water in the vicinity of the anode (positive pole). The radicals lead to the corrosion of the DLC layer in a manner analogous to that in the case of a plasma, as described above. After the DLC layer has corroded through, the local oxidation of the underlying silicon finally takes place. The process takes place exclusively in the anodic regions of the component, that is to say those regions at which a positive polarity prevails during storage. In the reverse-biased case, these are, for example in a planar diode with a VLD edge structure, the outer chip region with the channel stopper and the preceding n-doped region up to the beginning of the p-type zone. At the counterelectrode, that is to say—in the example mentioned—at the $p^+$-type well and in the adjoining more weakly doped p-type edge zone, by contrast, hydrogen and thus a reducing atmosphere arises, which prevents an oxidation in this zone. (It should be pointed out at this juncture that in the case of forward-biased loading, the polarities are interchanged and the p-type well forms the anode and the $n^+$-type emitter on the wafer rear side forms the cathode. Since they are responsible for "normal" current flow in the diode, these zones are designated correspondingly in the illustrations illustrated below as in general usage.)

In order to prevent the electrochemical corrosion of the DLC passivation layer, it is also proposed to admix with the latter a certain portion of Si, which can prevent attackability with respect to oxygen free radicals. Such a layer can then only be etched in a fluorine-oxygen plasma and is inherently resistant to the corrosion mechanism described.

However, defect sites in an Si-doped DLC passivation layer form potential points of attack for a local oxidation in such disturbed regions. As a result of the strain produced by the locally growing oxide, they can lead to the chipping of the DLC layer and propagate further proceeding from such sites. Therefore, it is important either to avoid such defect sites entirely, but that is unrealistic since there is a finite defect density in every fabrication, or to modify the process such that it becomes more tolerant of defects. One possibility consists in depositing onto the primary DLC layer a second (likewise non-oxidizable) passivation layer having a good moisture blocking property, such as, for example, an Si nitride layer or a second Si-doped DLC layer as redundant coating—if appropriate after an intermediate cleaning.

A second alternative proposed here consists in protecting the anodic region of the Si interfaces (at the edge) themselves against the oxidation by using an oxide that is already present. (This can, of course, also be taken into consideration as an additional option for redundancy coating.)

Since, the direct contact of the DLC layer with the active Si substrate is then important for the formation of rapid surface states in order to be able to guarantee a fast charge exchange during rapid switching operations and hence always stable potential conditions, an oxide interlayer is prohibited, on the other hand, in the regions over which the space charge zone extends at the surface.

An explanation will be given below, on the basis of exemplary embodiments, of how both (apparently conflicting) requirements can nevertheless be fulfilled for solving the problem in an edge structure proposed here.

FIG. 8 illustrates a high-voltage diode with a VLD edge termination according to the prior art. In the case of the VLD edge, the highly doped $p^+$-type well is adjoined by a weaker p-type doping with an outwardly decreasing dose (variation of lateral doping), which has the task of attenuating the electric field on account of the great curvature of the potential lines at the $p^+$-type well edge. From the end of the VLD zone as far as the channel stopper there generally remains a certain section in which the basic doping passes to the surface and across which a part of the reverse voltage is likewise reduced. The potential distribution in the reverse-biased case for this structure is illustrated in FIG. 9. In this case, the width of the VLD zone was fixed at 1100 μm and the width of the channel stopper at 50 μm. The total edge width is 1500 μm.

The region from the pn junction as far as the channel stopper forms the jeopardized zone over which the anodic oxidation can extend. The p-doped regions, by contrast, are no longer at anodic potential in the reverse-biased case, and are therefore not exposed to the oxygen free radicals either. A sharp boundary for the corrosion, lying directly at the pn junction, could always be observed in corresponding H3TRB test series.

In order to create the precondition for the use of an oxide layer as passivation for the anodic region, care must be taken to ensure that no more potential reduction takes place across the region over which the oxide layer extends. Consequently, the space charge zones end directly at the pn junction. This is achieved by virtue of the fact that a highly doped $n^+$-type zone, which provides for an abrupt potential reduction, directly adjoins the p-type zone running out. The VLD zone then either extends directly as far as the $n^+$-type zone or is alternatively lengthened as far as that by a corresponding packing with a p-type doping with a constant dose. By virtue of the $n^+$-type zone preceding the channel stopper, the intervening region becomes field-free. As an alternative, therefore, it is also possible for the channel stopper to be widened and led as far as the pn junction. Under this precondition, the oxide layer already suffices for the passivation of the n-type zone by itself, since external charges cannot have an influence in this region. In the active p-doped region, by contrast, the potential distribution is protected by the DLC layer.

Various embodiments of the structure according to the invention are illustrated in FIGS. 1 to 6. It is possible to effect both an additional metallization on the $n^+$-type zones and an additional covering of the oxide layer by using the (Si-doped) DLC layer. Defect sites that are possibly present then no longer offer a point of attack to the ingoing oxygen free radicals, since the underlying silicon is already covered with oxide.

Figure 7:
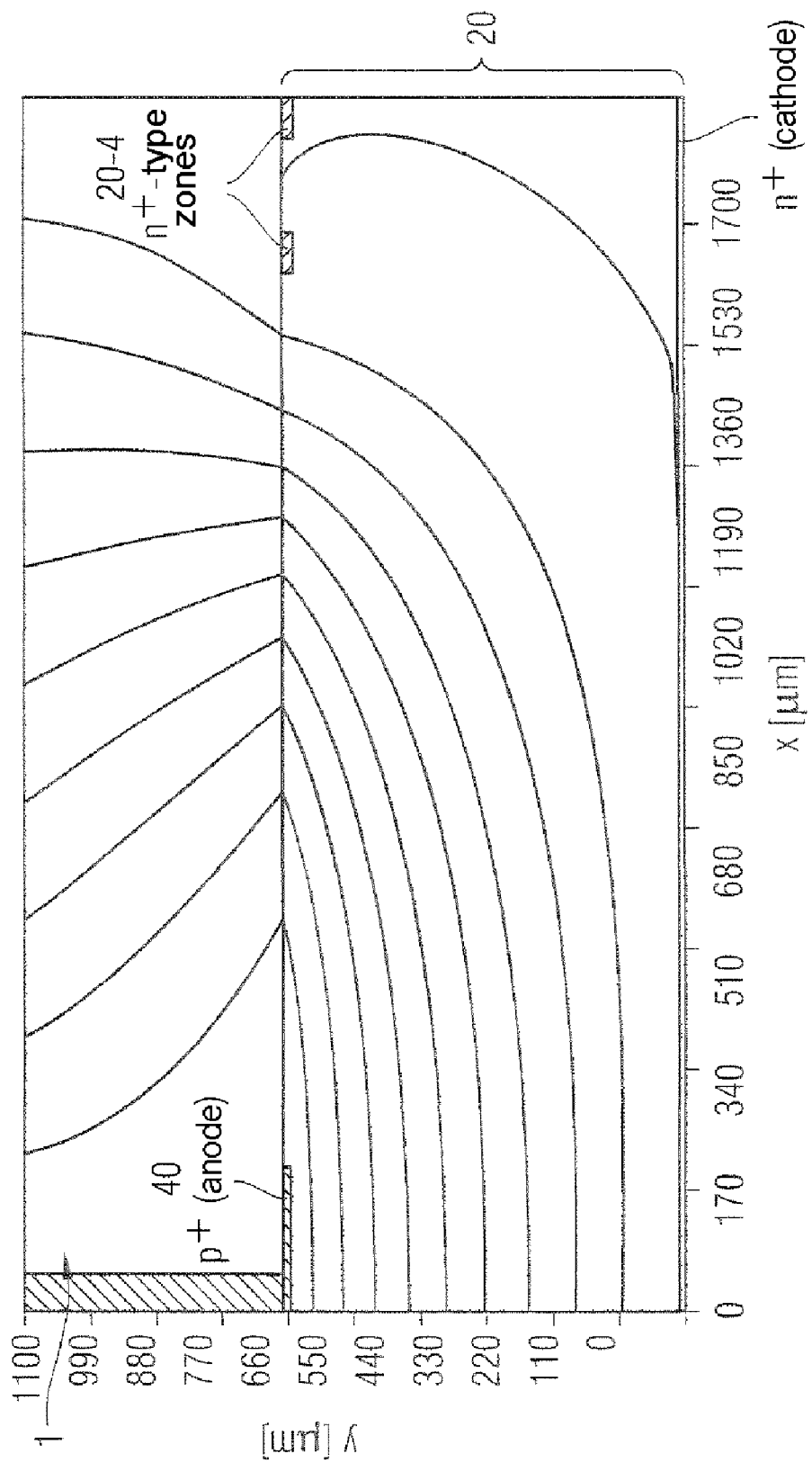
FIG. 7 illustrates, in the form of a graph, the potential distribution such as may be present in embodiments of a semiconductor component arrangement.

The influence of these measures on the blocking capability is very small. In FIG. 7, the potential distribution was calculated for the structure proposed. In this case, the VLD zone was lengthened by a 150 μm wide p-zone having a constant doping (dose=$1 \cdot 10^{11}$ cm$^{-2}$). Under these boundary conditions, the reverse voltage decreases merely from 7911 V to 7907 V. The widening of the equipotential edge zone has a favorable influence on the potential distribution, by contrast. This is because, as a result, the outermost equipotential line, corresponding to the applied reverse voltage, is pulled inward to a greater extent and the space charge zone is thus prevented from erupting into the chip edge. That is the precondition, however, for the fact that the leakage currents remain small in the case of the sawn chip. That is avoided in FIG. 7 for the same edge width—in contrast to the example in FIGS. 8 and 9.

The structure proposed thus additionally includes the potential for a certain edge shrink with an only marginally changed blocking capability.

The heart of the invention consists in effectively combating possible points of attack with respect to an anodic oxidation of the semiconductor material as a result of defect sites in an Si-doped DLC passivation layer by a local covering of the semiconductor surface with an oxide layer. The "corrosion pitting" proceeding from such defect sites as a result of the lattice strain that arises in the case of a locally growing oxide is avoided if the regions of the semiconductor surface which are potentially exposed to the anodic oxidation are already present in oxidized form. In order, on the other hand, to avoid the oxide interlayer—which is undesirable for a rapid reactivity of the component—below an electrically active DLC layer in the regions of the component where the space charge zone passes to the surface, it is proposed to keep the oxide-covered anodic region field-free by using a sufficiently high n-type doping subsequent to the p-type zone.

Parasitic RC charge-reversal time constants formed by the oxide capacitance C and the resistance R—in series—of the DLC layer are thus avoided.

A certain run-out section for the space charge zone before the highly doped n-type anode zone may be useful in this case in order to attenuate the abrupt potential reduction and to avoid high field strengths in this region. This may be effected either by using an acceptable additional implantation with a low, constant dose or by using a corresponding modification of the implantation mask for the lateral VLD dose distribution.

Before the semiconductor component arrangement according to the invention is explained in detail on the basis of various embodiments, firstly reference will be made to semiconductor component arrangements that were taken as a basis in the development of the present invention.

One exemplary embodiment is the high-voltage diode described in accordance with FIGS. 1 to 6. The construction principle proposed may, of course, also be applied in principle to other high-voltage power components. Further exemplary embodiments would therefore be the application in the case of SIPMOS or COOLMOS power transistors, thyristors, JFETs, IGBTs, Schottky diodes or Si- or SiC-based sensors with a planar or mesa-type edge termination.

FIG. 8 illustrates a high-voltage edge termination with a VLD zone and a channel stopper zone.

FIG. 9 illustrates a simulation of the potential distribution for the edge termination illustrated in FIG. 8. The edge width is 1500 μm, the width of the VLD zone is 1100 μm, the basic doping is $7 \cdot 10^{12}$ cm$^{-3}$ and the reverse voltage is 7911 volts.

Figure 3:
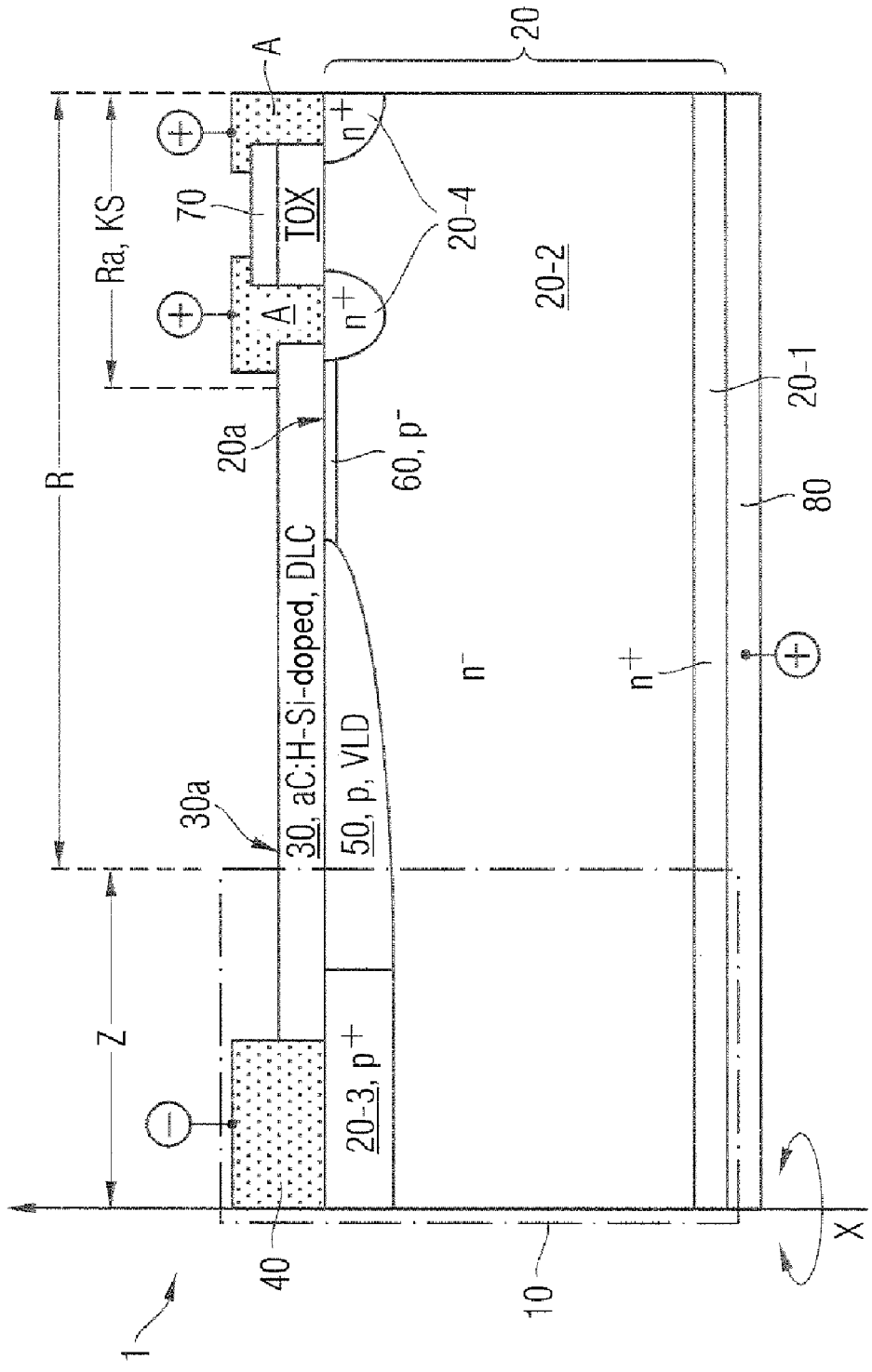
FIG. 3 illustrates a schematic and sectional side view of a third embodiment of a semiconductor component arrangement.

FIGS. 1 and 3 illustrate high-voltage edge terminations according to the invention with an electrochemically robust passivation construction. Instead of the p-type extension with a laterally constant dose, as an alternative it is also possible for the VLD zone to be correspondingly widened.

FIGS. 1 to 6 illustrate high-voltage edge terminations according to the invention with an electrochemically robust passivation construction.

FIG. 7 illustrates a graph of a simulation of the potential distribution for the edge termination according to the invention as illustrated in FIGS. 1 to 6. The width of the edge, of the VLD zone and the basic doping are unchanged in comparison with a simulation in accordance with FIG. 9 of a known arrangement. A flat, laterally constant p-type doping having a width of 150 μm and a dose of $1 \cdot 10^{11}$ cm$^{-2}$ was assumed between the VLD zone and the first $n^+$-type zone. The reverse voltage is 7907 V under these boundary conditions. Such a semiconductor component arrangement 1' is illustrated in FIG. 8 and is explained in more detail with regard to the potential profile generated in this case in FIG. 9.

FIG. 9 illustrates, in schematic and sectional side view, an embodiment of a semiconductor component arrangement 1' produced in a conventional manner.

The semiconductor component arrangement 1' illustrated here is based on a semiconductor material region 20 having a surface region 20a. The semiconductor material region 20 has a lower or first region or section 20-1, which is $n^+$-doped. A positive potential is applied thereto, at least in the illustration of the figure. It is adjoined by a second region 20-2, which is formed in n-doped fashion.

The semiconductor material region 20 is illustrated in section in the figure, to be precise in lateral extent only in one direction, with the result that the overall construction of the semiconductor component arrangement 1' illustrated here is produced in a rotationally symmetrical manner by rotating the arrangement illustrated about the indicated axis X of rotation or axis X of symmetry.

Cornered chips, e.g., having rounded corners, are also conceivable.

The semiconductor material region 20 is subdivided laterally into a central region Z, in which the actual arrangement of the semiconductor components 10 provided is formed, and into an edge region R, which serves for the electrical edge termination of the semiconductor component arrangement 1'.

The central region Z has a single semiconductor component 10 in the arrangement in the figure. However, it is also possible to provide an arrangement of a plurality of semiconductor components 10, if appropriate also different semiconductor components 10.

A diode is illustrated as the semiconductor component 10 in the figure. The diode results as a combination of a $p^+$-doped doping zone 20-3 in the region of the surface 20a of the semiconductor material region 20 with the first and second sections 20-1 and 20-2 of the semiconductor material region 20 having n-type doping. A corresponding contact metallization 40 is formed directly on the surface 20a and in contact with the doping zone 20-3, a connection to a negative potential being illustrated in the figure. The metallization 40 may be formed e.g., from aluminum.

The edge region R is covered with a passivation layer 30 in order to enable a corresponding potential profile or field profile from the semiconductor material region 20 toward the edge. In this case, the $n^+$-doped channel stopper or channel stopper region 20-4 is also expedient.

In the case of the conventional embodiment of FIG. 8, a doping zone 50 having p-type doping is provided in the transition between the central region Z and the edge region R of the semiconductor material region 20 in the surface region 20a. The doping zone 50 having p-type doping is intended to have a varying dopant concentration, to be precise in a laterally decreasing manner from the central region Z toward the edge region R. On account of this circumstance, the doping zone 50 is also referred to as a VLD zone. The VLD zone is intended to crucially configure the edge termination of the component arrangement 1'.

The channel stopper zone 20-4 of the channel stopper region KS may also be $p^+$-doped and be connected to the drain potential in low-resistance fashion via the sawing edge.

In the case of the conventional structure for a conventional integrated semiconductor component arrangement 1' in accordance with FIG. 8, the passivation layer region 30 is formed e.g., by an individual amorphous and hydrogen-containing carbon layer 30' or aC:H—Si passivation layer 30 with surface region 30a.

On account of the structure of the aC:H—Si-doped carbon layer, the latter is also referred to as a diamondlike carbon layer or as a DLC layer. Although the layer 30 alone may already prevent, in principle a superficial electrochemical or oxidative attack on the surface 20a or top side 20a of the semiconductor material region 20 in comparison with an aC:H layer not doped with Si, the layer 30 contains, under certain circumstances, defects which may in each case form as a starting point for an internal oxidation process in the passivation layer 30, proceeding from which the oxidative process can then move toward the surface region 20a of the semiconductor material region 20 and beyond into the semiconductor material itself. This is problematic particularly in the region of the channel stopper 20-4, and furthermore particularly when an anodic contact A is additionally formed there. Corresponding disadvantageous corrosions and material alterations may then occur in the extreme edge region or outer edge region Ra.

Embodiments of the present invention prevent such a disadvantageous corrosion and material alteration in the region of the edge passivation in the simplest possible manner.

FIGS. 1 to 6 illustrate an integrated circuit having a semiconductor component arrangements 1 according to the invention, in which an attack of electrochemical nature on the surface region 30a of the passivation layer regions 30 provided there does not take place on account of various measures.

FIG. 1 illustrates, in schematic and sectional side view, a first embodiment of the integrated semiconductor component arrangement 1 according to the invention.

The semiconductor component arrangement 1 according to the invention as is illustrated here is likewise based on a semiconductor material region 20 having a surface region 20a. The semiconductor material region 20 has a lower or first region 20-1, which is $n^+$-doped. A positive potential is applied thereto, at least in the illustration of the figure. This is adjoined by a second region 20-2, which is formed in $n^-$-doped fashion.

The semiconductor material region 20 is again illustrated in section in the figure, to be precise in lateral extent only in one direction, with the result that the overall construction of the semiconductor component arrangement 1 illustrated here is produced in a rotationally symmetrical manner by rotating the arrangement illustrated about the indicated axis of rotation or axis X of symmetry.

The semiconductor material region 20 is subdivided laterally into a central region Z, in which the actual arrangement of the semiconductor components 10 provided is formed, and into an edge region R, which serves for the electrical edge termination of the semiconductor component arrangement 1.

The central region Z again has a single semiconductor component 10 in the arrangement in the figure. However, it is also possible to provide an arrangement of a plurality of semiconductor components 10, if appropriate also different semiconductor components 10. A diode is illustrated as the semiconductor component 10 in the figure. The diode results as a combination of a $p^+$-doped doping zone 20-3 in the region of the surface 20a of the semiconductor material region 20 with the first and second sections 20-1 and 20-2 of the semiconductor material region 20 having n-type doping. A corresponding contact metallization 40 is formed directly on the surface 20a and in contact with the doping zone 20-3, a connection to a negative potential being illustrated in the figure. The metallization 40 may be formed e.g., from aluminum.

If it may supplementarily be noted that on the wafer rear side there is naturally likewise metallization 80, which e.g., also including aluminum and which represents the counter-electrode, in particular the cathode. In the reverse-biased case, it is positively polarized and, by an ohmic connection of the channel stopping zone, care is taken to ensure that the latter is likewise at the potential of the wafer rear side.

The edge region R is covered with a passivation layer region 30 in the form of an aC:H—Si layer in order to enable a corresponding potential or field profile from the semiconductor material region 20 toward the edge. A channel stopper region KS with two $n^+$-doped channel stopper zones 20-4 is also provided in this case.

In the embodiment according to the invention in accordance with FIG. 1 as well, a VLD zone 50 having p-type doping is provided in the transition between the central region Z and the edge region R of the semiconductor material region 20, the p-type doping decreasing laterally from the central region Z toward the edge of the semiconductor material region 20, in order thus to configure the edge termination in a suitable manner.

In addition, a extension layer 60 having p⁻-type doping may be provided in the surface region 20a of the semiconductor material region 20 between the VLD zone 50 and the channel stopper region KS with the channel stopper zones 20-4. In this case, the extension zone 60 is formed, in particular, with a layer thickness that lies below, and far below, the layer thickness of the VLD zone 50.

According to the invention, in the embodiment of FIG. 1, an oxide layer region TOX is formed on the surface region 20a of the semiconductor material region 20 in the outer edge region Ra of the semiconductor material region 20. The oxide layer region TOX is in the form of a single layer in the embodiment of FIG. 1, bears directly on the surface 20a of the semiconductor material region 20 and in this case is in direct electrical contact with the channel stopper zones 20-4 having n⁺-type doping of the channel stopper region KS, the channel stopper zones being connected via connections A. Consequently, the oxide layer region TOX directly follows the passivation region 30 with DLC structure.

The channel stopper region KS of the embodiment of FIG. 1 includes a plurality of channel stopper zones 20-4 or channel stopper elements 20-4 having n⁺-type doping.

Figure 2:
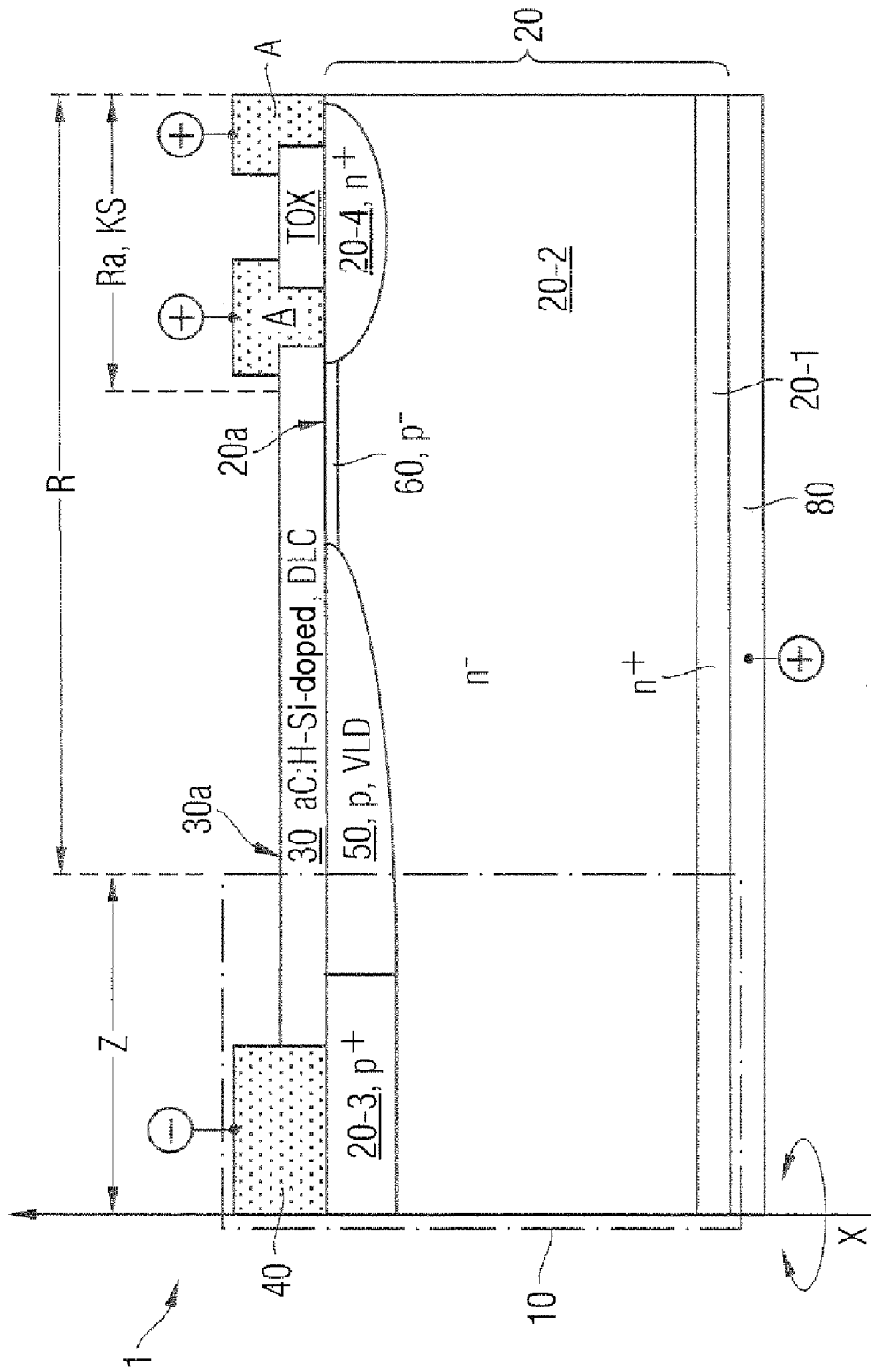
FIG. 2 illustrates a schematic and sectional side view of a second embodiment of a semiconductor component arrangement.

FIG. 2 illustrates, in schematic and sectional side view, a second embodiment of the integrated semiconductor component arrangement 1 according to the invention.

The semiconductor component arrangement 1 according to the invention that is illustrated here is again based on a semiconductor material region 20 having a surface region 20a. The semiconductor material region 20 has a lower or first region 20-1, which is n⁺-doped. A positive potential is applied thereto, at least in the illustration of the figure, via a rear side metallization 80. This is adjoined by a second region 20-2, which is formed in n⁻-doped fashion.

The semiconductor material region 20 is again illustrated in section in the figure, to be precise in lateral extent only in one direction, with the result that the overall construction of the semiconductor component arrangement 1 illustrated here is produced in a rotationally symmetrical manner by rotating the arrangement illustrated about the indicated axis of rotation or axis X of symmetry.

The semiconductor material region 20 is subdivided laterally into a central region Z, in which the actual arrangement of the semiconductor components 10 provided is formed, and into an edge region R, which serves for the electrical edge termination of the semiconductor component arrangement 1.

The central region Z again has a single semiconductor component 10 in the arrangement in the figure. However, it is also possible to provide an arrangement of a plurality of semiconductor components 10, if appropriate also different semiconductor components 10. A diode is illustrated as the semiconductor component 10 in the figure. The diode results as a combination of a p⁺-doped doping zone 20-3 in the region of the surface 20a of the semiconductor material region 20 with the first and second sections 20-1 and 20-2 of the semiconductor material region 20 having n-type doping. A corresponding contact metallization 40 is formed directly on the surface 20a and in contact with the doping zone 20-3, a connection to a negative potential being illustrated in the figure. The metallization 40 may be formed e.g., from aluminum.

The edge region R is covered with a passivation layer region 30 in the form of an aC:H—Si layer in order to enable a corresponding potential or field profile from the semiconductor material region 20 toward the edge. A channel stopper region KS with an n⁺-doped channel stopper zone 20-4 is also provided in this case.

In the embodiment according to the invention in accordance with FIG. 2, a VLD zone 50 having p-type doping is provided in the transition between the central region Z and the edge region R of the semiconductor material region 20, the p-type doping decreasing laterally from the central region Z toward the edge of the semiconductor material region 20, in order thus to configure the edge termination in a suitable manner.

In addition, a extension layer 60 having p⁻-type doping may be provided in the surface region 20a of the semiconductor material region 20 between the VLD zone 50 and the channel stopper region KS with the channel stopper zones 20-4. In this case, the extension zone 60 is formed, in particular, with a layer thickness that lies below, and far below, the layer thickness of the VLD zone 50.

In the case of the embodiment of FIG. 2, in contrast to the embodiment of FIG. 1, in the outer edge region Ra of the edge region R of the semiconductor material region 20, the channel stopper region KS is exclusively formed by one channel stopper zone 20-4 having n⁺-type doping.

FIG. 3 likewise illustrates, in schematic and sectional side view, a further embodiment of the integrated semiconductor component arrangement 1 according to the invention.

The semiconductor component arrangement 1 according to the invention that is illustrated here is again based on a semiconductor material region 20 having a surface region 20a. The semiconductor material region 20 has a lower or first region 20-1, which is n⁺-doped. A positive potential is applied thereto, at least in the illustration of the figure, via a rear side metallization 80. This is adjoined by a second region 20-2, which is formed in n⁻-doped fashion.

The semiconductor material region 20 is again illustrated in section in the figure, to be precise in lateral extent only in one direction, with the result that the overall construction of the semiconductor component arrangement 1 illustrated here is produced in a rotationally symmetrical manner by rotating the arrangement illustrated about the indicated axis of rotation or axis X of symmetry.

The semiconductor material region 20 is subdivided laterally into a central region Z, in which the actual arrangement of the semiconductor components 10 provided is formed, and into an edge region R, which serves for the electrical edge termination of the semiconductor component arrangement 1.

The central region Z again has a single semiconductor component 10 in the arrangement in the figure. However, it is also possible to provide an arrangement of a plurality of semiconductor components 10, if appropriate also different semiconductor components 10. A diode is illustrated as the semiconductor component 10 in the figure. The diode results as a combination of a p⁺-doped doping zone 20-3 in the region of the surface 20a of the semiconductor material region 20 with the first and second sections 20-1 and 20-2 of the semiconductor material region 20 having n-type doping. A corresponding contact metallization 40 is formed directly on the surface 20a and in contact with the doping zone 20-3, a connection to a negative potential being illustrated in the figure. The metallization 40 may be formed e.g., from aluminum.

The edge region R is covered with a passivation layer region 30 in the form of an aC:H—Si layer in order to enable a corresponding potential or field profile from the semiconductor material region 20 toward the edge. A channel stopper region KS with two n⁺-doped channel stopper zones 20-4 is also provided in this case.

In the embodiment according to the invention in accordance with FIG. 3 as well, a VLD zone 50 having p-type doping is provided in the transition between the central region Z and the edge region R of the semiconductor material region 20, the p-type doping decreasing laterally from the central region Z toward the edge of the semiconductor material region 20, in order thus to configure the edge termination in a suitable manner.

In addition, an extension layer 60 having p⁻-type doping may be provided in the surface region 20a of the semiconductor material region 20 between the VLD zone 50 and the channel stopper region KS with the channel stopper zones 20-4. In this case, the extension zone 60 is formed, in particular, with a layer thickness that lies below, and far below, the layer thickness of the VLD zone 50.

In the case of the embodiment of the semiconductor component arrangement according to the invention in accordance with FIG. 3, in a modification of the embodiment of FIG. 1, the oxide layer region TOX is formed in a manner covered with covering layer 70 from the surface region 20a of the semiconductor material region 20.

Figure 4:
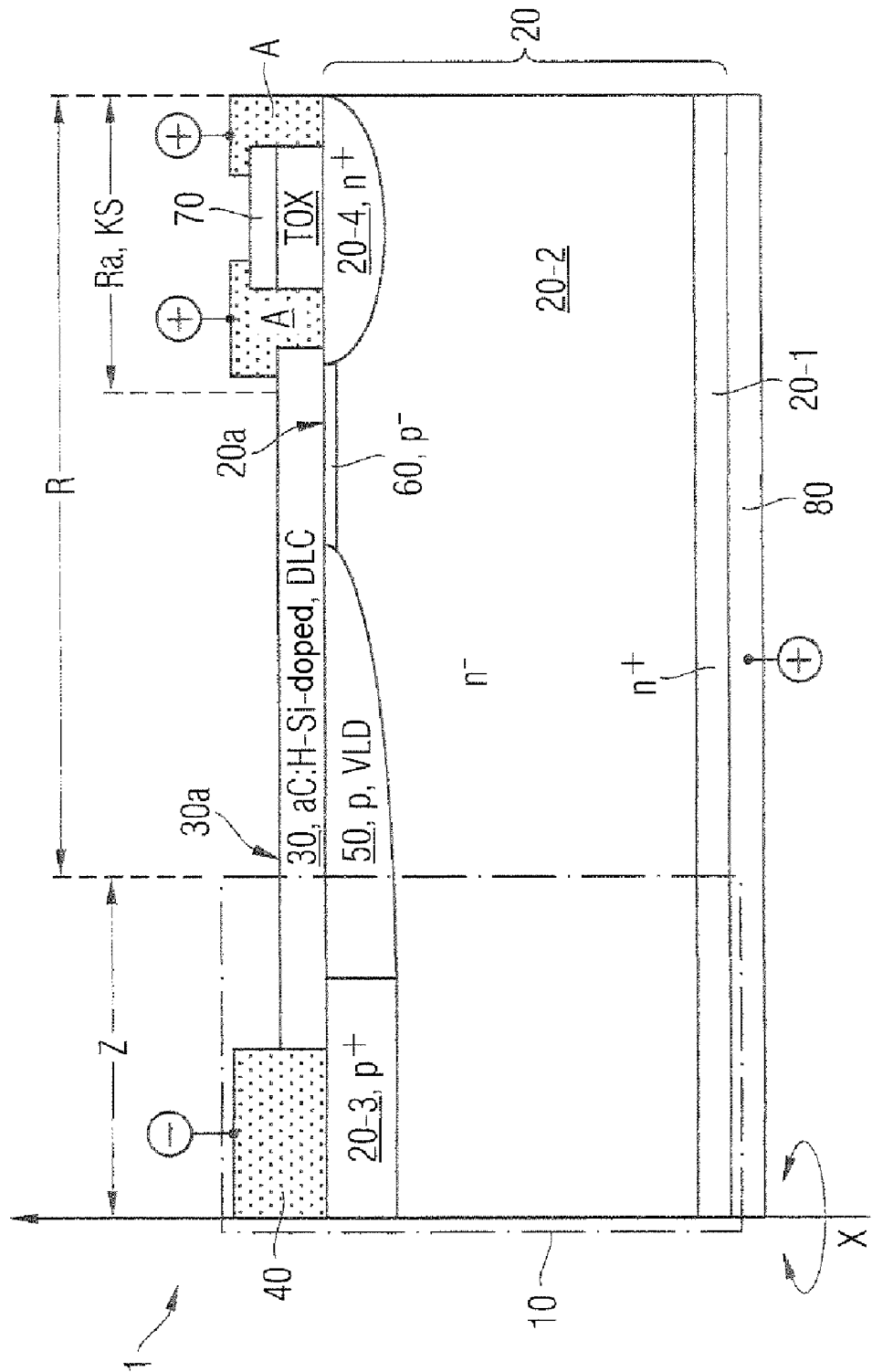
FIG. 4 illustrates a schematic and sectional side view of a fourth embodiment of a semiconductor component arrangement.

A first embodiment of the integrated semiconductor component arrangement 1 according to the invention is illustrated in schematic and sectional side view in FIG. 4.

The semiconductor component arrangement 1 according to the invention that is illustrated here is again based on a semiconductor material region 20 having a surface region 20a. The semiconductor material region 20 has a lower or first region 20-1, which is n⁺-doped. A positive potential is applied thereto, at least in the illustration of the figure, via a rear side metallization 80. This is adjoined by a second region 20-2, which is formed in n⁻-doped fashion.

The semiconductor material region 20 is again illustrated in section in the figure, to be precise in lateral extent only in one direction, with the result that the overall construction of the semiconductor component arrangement 1 illustrated here is produced in a rotationally symmetrical manner by rotating the arrangement illustrated about the indicated axis of rotation or axis X of symmetry.

The semiconductor material region 20 is subdivided laterally into a central region Z, in which the actual arrangement of the semiconductor components 10 provided is formed, and into an edge region R, which serves for the electrical edge termination of the semiconductor component arrangement 1.

The central region Z again has a single semiconductor component 10 in the arrangement in the figure. However, it is also possible to provide an arrangement of a plurality of semiconductor components 10, if appropriate also different semiconductor components 10. A diode is illustrated as the semiconductor component 10 in the figure. The diode results as a combination of a p⁺-doped doping zone 20-3 in the region of the surface 20a of the semiconductor material region 20 with the first and second sections 20-1 and 20-2 of the semiconductor material region 20 having n-type doping. A corresponding contact metallization 40 is formed directly on the surface 20a and in contact with the doping zone 20-3, a connection to a negative potential being illustrated in the figure. The metallization 40 may be formed e.g., from aluminum.

The edge region R is covered with a passivation layer region 30 in the form of an aC:H—Si layer in order to enable a corresponding potential or field profile from the semiconductor material region 20 toward the edge. A channel stopper region KS with an n⁺-doped channel stopper zone 20-4 is also provided in this case.

In the embodiment according to the invention in accordance with FIG. 4, a VLD zone 50 having p-type doping is provided in the transition between the central region Z and the edge region R of the semiconductor material region 20, the p-type doping decreasing laterally from the central region Z toward the edge of the semiconductor material region 20, in order thus to configure the edge termination in a suitable manner.

In addition, a extension layer 60 having p⁻-type doping may be provided in the surface region 20a of the semiconductor material region 20 between the VLD zone 50 and the channel stopper region KS with the channel stopper zones 20-4. In this case, the extension zone 60 is formed, in particular, with a layer thickness that lies below, and far below, the layer thickness of the VLD zone 50.

In the case of the embodiment of the semiconductor component arrangement 1 according to the invention in accordance with FIG. 4, in a modification of the embodiment in accordance with FIG. 3, the channel stopper region KS, in the outer edge region Ra of the semiconductor material region 20, is again formed with a single channel stopper zone 20-4 having n⁺-type doping.

Figure 5:
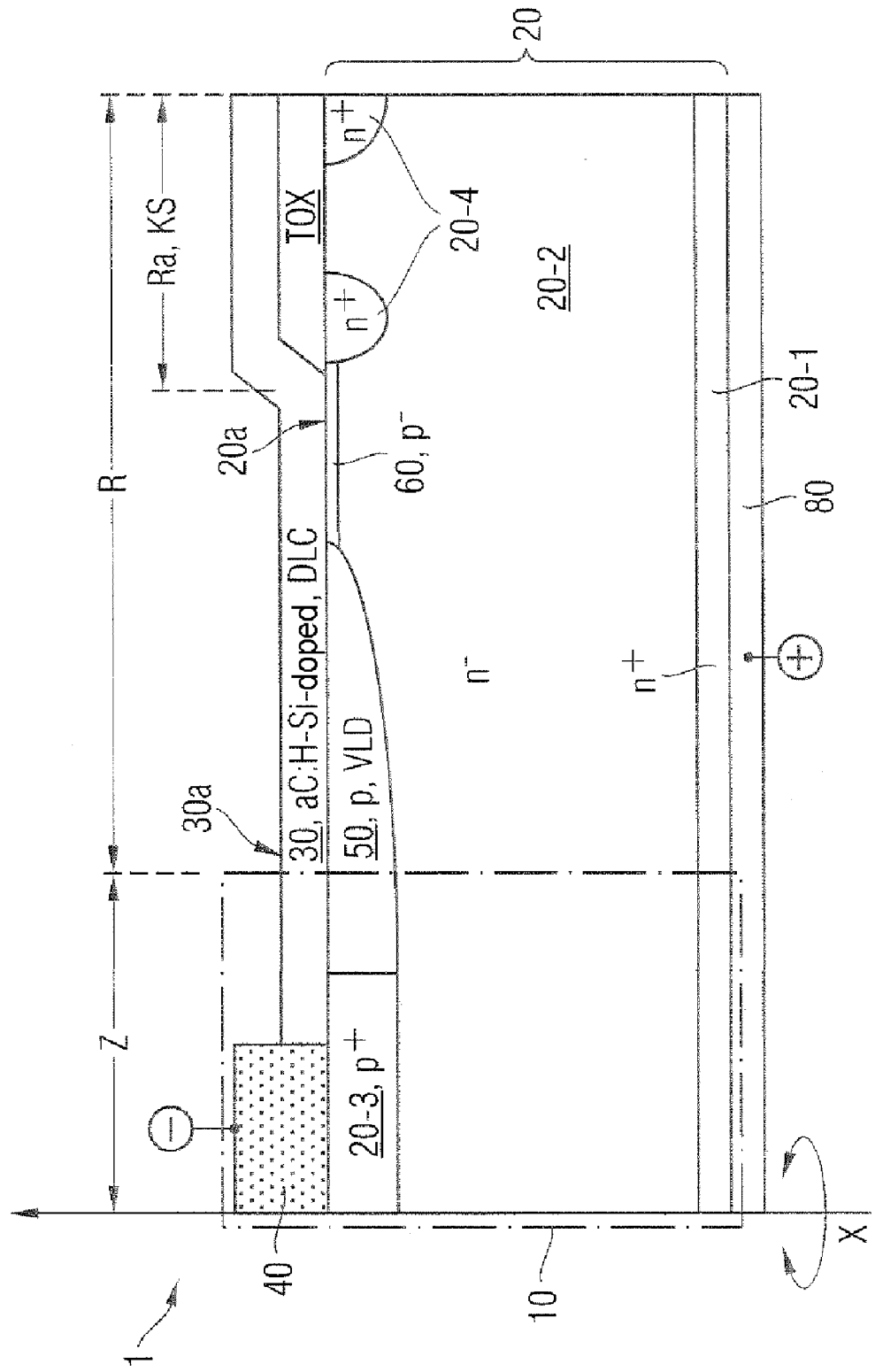
FIG. 5 illustrates a schematic and sectional side view of a fifth embodiment of a semiconductor component arrangement.

FIG. 5 illustrates, in schematic and sectional side view, a first embodiment of the integrated semiconductor component arrangement 1 according to the invention.

The semiconductor component arrangement 1 according to the invention that is illustrate here is again based on a semiconductor material region 20 having a surface region 20a. The semiconductor material region 20 has a lower or first region 20-1, which is n⁺-doped. A positive potential is applied thereto, at least in the illustration of the figure, via a rear side metallization 80. This is adjoined by a second region 20-2, which is formed in n⁻-doped fashion.

The semiconductor material region 20 is again illustrated in section in the figure, to be precise in lateral extent only in one direction, with the result that the overall construction of the semiconductor component arrangement 1 illustrated here is produced in a rotationally symmetrical manner by rotating the arrangement illustrated about the indicated axis of rotation or axis X of symmetry.

The semiconductor material region 20 is subdivided laterally into a central region Z, in which the actual arrangement of the semiconductor components 10 provided is formed, and into an edge region R, which serves for the electrical edge termination of the semiconductor component arrangement 1.

The central region Z again has a single semiconductor component 10 in the arrangement in the figure. However, it is also possible to provide an arrangement of a plurality of semiconductor components 10, if appropriate also different semiconductor components 10. A diode is illustrated as the semiconductor component 10 in the figure. The diode results as a combination of a p⁺-doped doping zone 20-3 in the region of the surface 20a of the semiconductor material region 20 with the first and second sections 20-1 and 20-2 of the semiconductor material region 20 having n-type doping. A corresponding contact metallization 40 is formed directly on the surface 20a and in contact with the doping zone 20-3, a connection to a negative potential being illustrated in the figure. The metallization 40 may be formed e.g., from aluminum.

The edge region R is covered with a passivation layer region 30 in the form of an aC:H—Si layer in order to enable a corresponding potential or field profile from the semiconductor material region 20 toward the edge. A channel stopper region KS with two n⁺-doped channel stopper zones 20-4 is also provided in this case.

In one embodiment according to the invention in accordance with FIG. 5 as well, a VLD zone 50 having p-type doping is provided in the transition between the central region Z and the edge region R of the semiconductor material region 20, the p-type doping decreasing laterally from the central region Z toward the edge of the semiconductor material region 20, in order thus to configure the edge termination in a suitable manner.

In addition, a extension layer 60 having p⁻-type doping may be provided in the surface region 20a of the semiconductor material region 20 between the VLD zone 50 and the channel stopper region KS with the channel stopper zones 20-4. In this case, the extension zone 60 is formed, in particular, with a layer thickness that lies below, and far below, the layer thickness of the VLD zone 50.

In one embodiment of a semiconductor component arrangement 1 according to the invention in accordance with FIG. 5, the channel stopper region KS, in the outer edge region Ra of the semiconductor material region 20, again includes a plurality of channel stopper zones 20-4 having n⁺-type doping and is furthermore completely covered by the oxide material region TOX. In this case, the oxide layer region TOX, for its part, is completely covered by the passivation layer region 30 of the DLC type extending as far as the outermost part of the edge R of the semiconductor material region 20 on the surface region 20a.

Figure 6:
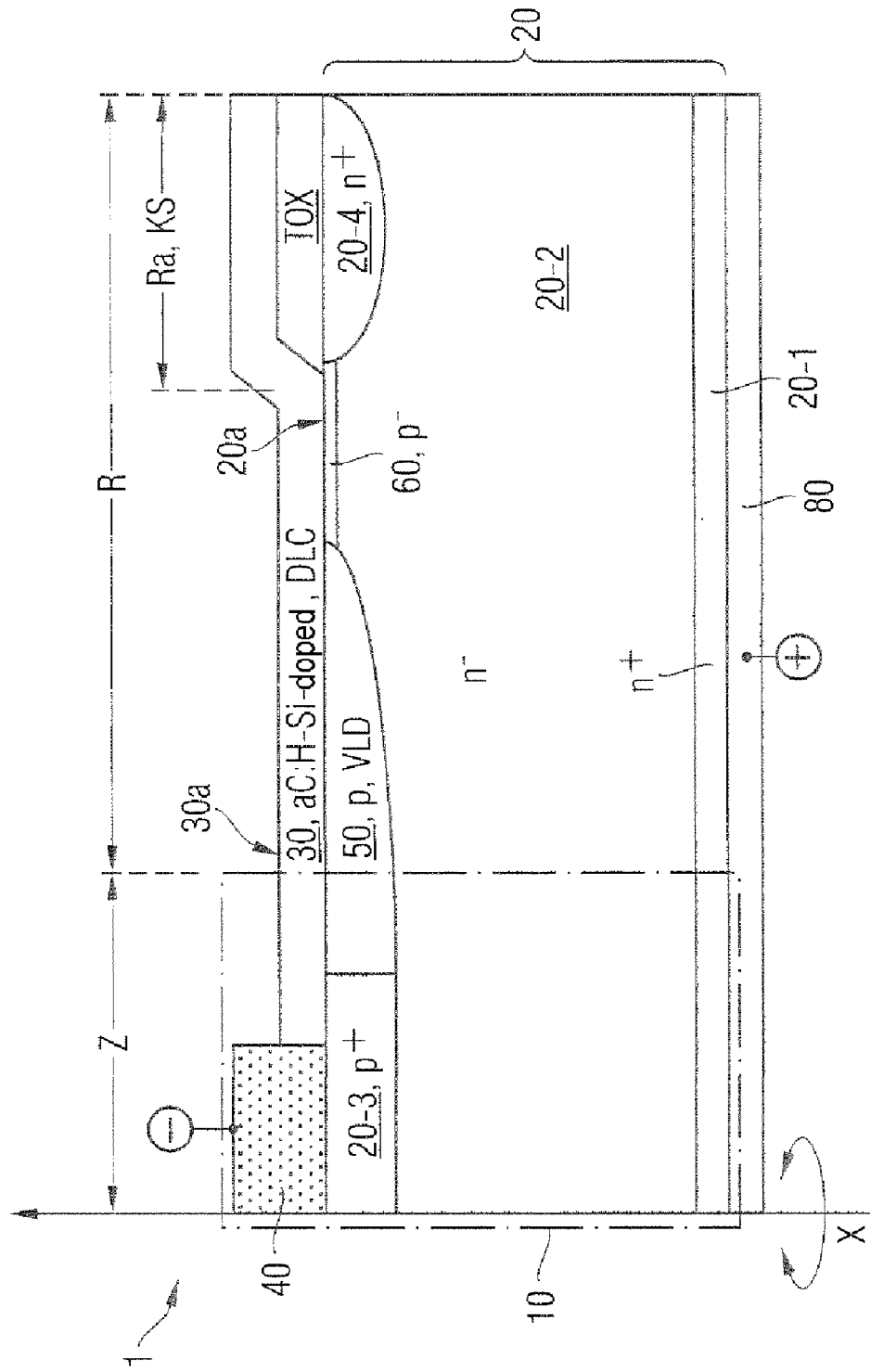
FIG. 6 illustrates a schematic and sectional side view of a sixth embodiment of a semiconductor component arrangement.

FIG. 6, too, illustrates, in schematic and sectional side view, an embodiment of the integrated semiconductor component arrangement 1 according to the invention.

The semiconductor component arrangement 1 according to the invention that is illustrated here is again based on a semiconductor material region 20 having a surface region 20a. The semiconductor material region 20 has a lower or first region 20-1, which is n⁺-doped. A positive potential is applied thereto, at least in the illustration of the figure, via a rear side metallization 80. This is adjoined by a second region 20-2, which is formed in n⁻-doped fashion.

The semiconductor material region 20 is again illustrated in section in the figure, to be precise in lateral extent only in one direction, with the result that the overall construction of the semiconductor component arrangement 1 illustrated here is produced in a rotationally symmetrical manner by rotating the arrangement illustrated about the indicated axis of rotation or axis X of symmetry.

The semiconductor material region 20 is subdivided laterally into a central region Z, in which the actual arrangement of the semiconductor components 10 provided is formed, and into an edge region R, which serves for the electrical edge termination of the semiconductor component arrangement 1.

The central region Z again has a single semiconductor component 10 in the arrangement in the figure. However, it is also possible to provide an arrangement of a plurality of semiconductor components 10, if appropriate also different semiconductor components 10. A diode is illustrated as the semiconductor component 10 in the figure. The diode results as a combination of a p⁺-doped doping zone 20-3 in the region of the surface 20a of the semiconductor material region 20 with the first and second sections 20-1 and 20-2 of the semiconductor material region 20 having n-type doping. A corresponding contact metallization 40 is formed directly on the surface 20a and in contact with the doping zone 20-3, a connection to a negative potential being illustrated in the figure. The metallization 40 may be formed e.g., from aluminum.

The edge region R is covered with a passivation layer region 30 in the form of an aC:H—Si layer in order to enable a corresponding potential or field profile from the semiconductor material region 20 toward the edge. A channel stopper region KS with an n⁺-doped channel stopper zone 20-4 is also provided in this case.

In the embodiment according to the invention in accordance with FIG. 6 as well, a VLD zone 50 having p-type doping is provided in the transition between the central region Z and the edge region R of the semiconductor material region 20, the p-type doping decreasing laterally from the central region Z toward the edge of the semiconductor material region 20, in order thus to configure the edge termination in a suitable manner.

In addition, a extension layer 60 having p⁻-type doping may be provided in the surface region 20a of the semiconductor material region 20 between the VLD zone 50 and the channel stopper region KS with the channel stopper zones 20-4. In this case, the extension zone 60 is formed, in particular, with a layer thickness that lies below, and far below, the layer thickness of the VLD zone 50.

In the case of the embodiment of FIG. 6, the channel stopper region KS has a single channel stopper zone 20-4 having n⁺-type doping, which is again completely covered by the oxide layer region TOX, which, for its part, is again completely covered by the passivation layer region 30 of the DLC type.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
a semiconductor material having a surface, wherein the semiconductor material is subdivided laterally into a central region and an edge region;
an arrangement of one or more semiconductor components that is formed in the central region of the semiconductor material;
a planar passivation layer that is formed on the surface in the edge region, the passivation layer comprising a planar bottom surface, wherein an entirety of the planar bottom surface is in direct contact with the surface of the semiconductor material;
two or more channel stopper zones that are connected via connections and that are formed in the edge region; and
an oxide layer that is provided on the surface of the semiconductor material in the edge region, the oxide layer being separate from the passivation layer, wherein the oxide layer is formed above and in contact with the two or more channel stopper zones and is adjacent to the passivation layer with only one of the connections in between regions and directly follows the passivation layer.

2. The integrated circuit of claim 1, wherein the oxide layer or a part of the oxide layer is formed in an outer edge region of the edge region of the semiconductor material.

3. The integrated circuit of claim 1, further comprising a covering layer, covering at least part of the oxide layer.

4. The integrated circuit of claim 3, comprising wherein the covering layer is formed by the passivation layer region.

5. The integrated circuit of claim 1, wherein at least part of the oxide layer is formed as a material deposited on the surface of the semiconductor material.

6. The integrated circuit of claim 1, wherein at least one of the one or more channel stopper regions is formed as one doping zone or as a plurality of doping zones of a first conductivity type in a region of the surface of the semiconductor material.

7. The integrated circuit of claim 1, further comprising a doping zone having a varying doping that decreases toward the edge region, the doping zone having a second conductivity type different than a first conductivity type of at least one of the one or more channel stopper regions, the doping zone formed in a region of the surface of the semiconductor material in a transition region between the central region and the edge region of the semiconductor material.

8. The integrated circuit of claim 7, wherein the doping zone is formed such that it reaches as far as an outer edge region of the semiconductor material.

9. The integrated circuit of claim 7, wherein the doping zone is formed such that it reaches as far as the one or more channel stopper regions of the semiconductor material.

10. The integrated circuit of claim 1, further comprising a hydrogen-containing amorphous carbon layer formed as a covering layer.

11. The integrated circuit of claim 10, wherein the covering layer is silicon-doped with a dopant concentration of silicon of at least one atomic percent.

12. The integrated circuit of claim 10, wherein the covering layer is silicon doped with a dopant concentration of silicon of less than 50 atomic percent.

13. The integrated circuit of claim 1, further comprising a silicon nitride layer formed as a covering layer.

14. The integrated circuit of claim 1, wherein the passivation layer comprises a base layer as a part of the passivation layer which directly adjoins the surface of the semiconductor material.

15. The integrated circuit of claim 14, wherein the base layer is formed with at least one of materials from a group consisting of a dielectric, an insulator, a silicon oxide, a silicon nitride, a polyimide, a silicone encapsulant, a semi-insulating material, an amorphous silicon, a carbon material, a silicon carbide, an amorphous carbon and a hydrogen-doped amorphous carbon.

16. The integrated circuit of claim 1, wherein the arrangement of one or more semiconductor components is formed with at least one of the semiconductor components from a group consisting of a power transistor, a thyristor, a JFET, an IGBT and a Schottky diode.

17. The integrated circuit of claim 1, wherein the edge region is formed with a planar edge termination or with a mesa-type edge termination.

18. The integrated circuit of claim 1, wherein the edge region comprises a chip edge.

19. A method for producing an integrated circuit, comprising:
    forming a semiconductor material having a surface, wherein the semiconductor material is subdivided laterally into a central region and an edge region;
    forming an arrangement of one or more semiconductor components in the central region of the semiconductor material;
    forming a planar passivation layer on the surface of the semiconductor material in the edge region thereof, wherein the passivation layer comprises a planar bottom surface and an entirety of the planar bottom surface is in direct contact with the surface of the semiconductor material;
    providing an oxide layer on the surface of the semiconductor material in the edge region separate from the passivation layer; and
    forming a channel stopper region comprising two or more doping zones, wherein the two or more doping zones have a first conductivity type and are formed in the edge region of the surface of the semiconductor material and are connected via connections,
    wherein the oxide layer is adjacent to the passivation layer with only one of the connections in between.

20. The method of claim 19, further comprising forming the oxide layer or a part of the oxide layer in an outer edge region of the edge of the semiconductor material, the outer edge region being spaced apart and remote from the central region.

21. The method of claim 19, further comprising covering the oxide layer or a part of the oxide layer with a covering layer.

22. The method for producing a semiconductor component arrangement of claim 21, comprising forming the covering layer or a part of the covering layer by the passivation layer region or by a part of the passivation layer region.

23. The method of claim 19, further comprising forming the oxide layer or a part of the oxide layer by a physicochemical conversion of the surface of the semiconductor material.

24. The method of claim 19, further comprising forming the oxide layer or a part of the oxide layer as a material deposited on the surface of the semiconductor material.

25. The method of claim 19, further comprising forming the oxide layer or a part of the oxide layer above one or more channel stopper regions and in contact with the one or more channel stopper regions.

26. The method of claim 19, further comprising forming a further doping zone having a varying doping that decreases toward the edge region, the further doping zone of a second conductivity type and formed in a region of the surface of the semiconductor material in a transition region between the central region and the edge region of the semiconductor material.

27. The method of claim 26, further comprising forming the further doping zone such that it reaches as far as the outer edge region of the semiconductor material.

28. The method of claim 26, further comprising forming the further doping zone such that it reaches as far as the channel stopper region of the semiconductor material.

29. The method of claim 19, further comprising forming a hydrogen-containing amorphous carbon layer as a covering layer.

30. The method of claim 29, further comprising forming the covering layer with a dopant concentration of silicon of at least one atomic percent.

31. The method of claim 29, further comprising forming the covering layer with a dopant concentration of silicon of less than 50 atomic percent.

32. The method of claim 19, further comprising forming a silicon nitride layer as a covering layer.

33. The method of claim 19, further comprising forming the passivation layer comprising a base layer as a part of the passivation layer which directly adjoins the surface of the semiconductor material.

34. The method of claim 33, further comprising forming the base layer with at least one of materials from a group consisting of a dielectric, an insulator, a silicon oxide, a silicon nitride, a polyimide, a silicone encapsulant, a semi-insulating material, an amorphous silicon, a carbon material, a silicon carbide, an amorphous carbon and a hydrogen-doped amorphous carbon.

35. The method of claim 19, further comprising forming the arrangement of one or more semiconductor components with at least one of the semiconductor components from a group consisting of a power transistor, a thyristor, a JFET, an IGBT, a high-voltage Pin diode and a Schottky diode.

36. The method of claim 19, further comprising forming the edge region with a planar edge termination or with a mesa-type edge termination.

37. The method of claim 19, wherein the edge region comprises a chip edge.

38. An integrated circuit comprising:
- a semiconductor material having a surface, wherein the semiconductor material is subdivided laterally into a central region and an edge region;
- an arrangement of one or more semiconductor components that is formed in the central region of the semiconductor material;
- a planar passivation layer that is formed on the surface of the semiconductor material in the edge region, the passivation layer comprising a planar bottom surface, wherein an entirety of the planar bottom surface is in direct contact with the surface of the semiconductor material;
- one or more channel stopper zones that are connected via connections and that are formed in the edge region; and
- an oxide layer that is provided on the surface of the semiconductor material in the edge region separate from the passivation layer, wherein the oxide layer is formed above and in contact with the one or more channel stopper regions, wherein the oxide layer or a part of the oxide layer is formed in an outer edge region of the edge of the semiconductor material, the outer edge region being spaced apart and remote from the central region, and wherein the oxide layer is adjacent to the passivation layer with only one of the connections in between.

39. The integrated circuit of claim 38, wherein the edge region comprises a chip edge.

* * * * *